United States Patent [19]
Shen et al.

[11] Patent Number: 5,479,121
[45] Date of Patent: Dec. 26, 1995

[54] COMPENSATING CIRCUIT FOR MOSFET ANALOG SWITCHES

[75] Inventors: Wei-Chen Shen, Hsinchu; Yen-Bin Gu; Chu-Chang Lin, both of Taipei; Ming-Jer Chen, Hsinchu; Po-Chin Hsu, Taipei; Tien-Yu Wu, Hsinchu, all of Taiwan

[73] Assignee: Industrial Technology Research Institute, Hsinchu, Taiwan

[21] Appl. No.: 394,771

[22] Filed: Feb. 27, 1995

[51] Int. Cl.$^6$ ................................................. G11C 27/02
[52] U.S. Cl. ............................ 327/94; 327/317; 327/362; 327/378
[58] Field of Search ............................ 327/91, 94, 317, 327/341, 362, 378, 427, 434, 436

[56] References Cited

U.S. PATENT DOCUMENTS

| | | | |
|---|---|---|---|
| 3,969,636 | 7/1976 | Baertsch et al. | 327/427 |
| 4,604,584 | 8/1986 | Kelley | 327/91 |
| 4,894,620 | 1/1990 | Nagaraj | 327/91 |
| 5,343,089 | 8/1994 | Itakura et al. | 327/94 |

FOREIGN PATENT DOCUMENTS

| | | | |
|---|---|---|---|
| 0046549 | 3/1982 | European Pat. Off. | 327/94 |
| 57-60593 | 4/1982 | Japan | 327/94 |
| 58-169396 | 10/1983 | Japan | 327/94 |
| 59-96599 | 6/1984 | Japan | 327/94 |
| 63-96800 | 4/1988 | Japan | 327/94 |
| 739549 | 6/1980 | U.S.S.R. | 327/362 |
| WO90/03034 | 3/1990 | WIPO | 327/94 |

OTHER PUBLICATIONS

"Switch Induced Error Voltage on a Switched Capacitor" by Sheutthe, IEEE Journal of Solid State Circuits, vol. SC–19, No. 4, Aug. 1984, pp. 519–525.
"Measurement & Modeling of Charge Feed Through in n–Channel MOS Analog Switches" by Wilson et al, IEEE Journal of Solid State Circuits, vol. SC–20, No. 6, Dec. 1985 pp. 1206–1212.
"Measurement & Analysis of Charge Injection in MOS Analog Switches" by Shieh et al, IEEE Journal of Solid State Circuits, vol. SC–22, No. 2, Apr. 1987, pp. 277–281.
"Charge Injection in Analog MOS Switches" by Wegmann et al, IEEE Journal of Solid State Circuits, vol. SC–22, No. 6, Dec. 1987, pp. 1091–1097.
"New Observation of Charge Injection in MOS Analogue Switches" by Chen et al, Electronics Letters, vol. 30, No. 3, Feb. 3, 1994, pp. 213–214.
"All–MOS Charge Redistribution Analog–to–Digital Conversion Techniques–Part I" by McCreary & Gray, IEEE Journal of Solid State Circuits, vol. SC–10, No. 6, Dec. 1975, pp. 371–379.
"An 8–Bit 50–MHz CMOS Subranging A/D converter with Pipelines Wide–Band S/H" by Ishikawa & Tosukahara, IEEE Journal of Solid State Circuits, vol. 24, No. 6, Dec. 1989, pp. 1485–1491.
"A High Speed Sample-and-Hold Technique Using A Miller Hold Capacitance," by Lim & Wooley, IEEE Journal of Solid State Circuits, vol. 26, No. 4, Apr. 1991, pp. 643–651.
"Dummy Transistor Compensation of Analog MOS Switches" by Eichenberger & Guggenbuhl, IEEE Journal of Solid State Circuits, vol. 24, No. 4, Aug. 1989, pp. 1143–1145.
"On Charge Injection in Analog MOS Switches & Dummy Switch Compensation Techniques" by Eichenberger & Guggenbuhl, IEEE Transactions on Circuits And Systems, vol. 37, No. 2, Feb. 1990, pp. 256–264.

*Primary Examiner*—Terry Cunningham
*Attorney, Agent, or Firm*—George O. Saile; Larry J. Prescott

[57] ABSTRACT

This invention deals with the problem of an error voltage in a MOSFET analog switch sample and hold circuit caused by the turn off charge in the MOSFET analog switch. The invention provides a compensating circuit which can be adjusted to exactly compensate for the turn off charge which causes the error so that the error can be reduced to zero or nearly zero. The compensating circuit can be used in both open loop and closed loop sample and hold circuits. The compensating circuit can be used in combination with a Miller feedback circuit for eliminating the error voltage.

20 Claims, 10 Drawing Sheets

COMPENSATING CIRCUIT FOR MOSFET ANALOG SWITCHES

BACKGROUND OF THE INVENTION (1) Field of the Invention

This invention relates to the problem of error voltage in a metal oxide semiconductor field effect transistor, or MOSFET, analog switch in a sample and hold circuit for an analog to digital converter caused by the turn off charge in the MOSFET analog switch. This invention provides a compensating circuit which reduces the error voltage to zero or nearly zero.

(2) Description of Related Art

Increasing demands on the quality of signal processing have made requirements for high speed, high precision analog to digital converter circuits more stringent. The MOSFET analog switch in a sample and hold circuit is a key part of analog to digital converters but the turn off charge in the MOSFET analog switch has a detrimental effect on precision. The turn off charge is the charge that flows from the MOSFET analog switch to the holding capacitor of the equivalent after the MOSFET analog switch has been turned off.

A number of articles deal with the problem of this turn off charge error including the following: "Switch-Induced Error Voltage on a Switched Capacitor," by Sheu and Hu, IEEE JOURNAL OF SOLID-STATE CIRCUITS, Vol. SC-19, No. 4, August 1984, pages 519–525; "Measurement and Modeling of Charge Feedthrough in n-Channel MOS Analog Switches," by Wilson et al, IEEE JOURNAL OF SOLID-STATE CIRCUITS, Vol. SC-20, No. 6, December 1985, pages 1206–1213; "Measurement and Analysis of Charge Injection in MOS Analog Switches," by Shieh et al, IEEE JOURNAL OF SOLID-STATE CIRCUITS, Vol. SC- 22, No. 2, April 1987, pages 277–281; "Charge Injection in Analog MOS Switches," by Wegmann et al, IEEE JOURNAL OF SOLID-STATE CIRCUITS, Vol. SC-22, No. 6, December 1987, pages 1091–1097; "New Observation of Charge Injection in MOS Analogue Switches," by Chen et al, ELECTRONICS LETTERS, Vol. 30, No. 3, Feb. 3, 1994, pages 213–214; "All-MOS Charge Redistribution Analog-to-Digital Conversion Techniques-Part I," by McCreary and Gray, IEEE JOURNAL OF SOLID-STATE CIRCUITS, Vol. SC-10, No. 6, December 1975, pages 371–379; and "An 8-bit 50-MHz CMOS Subranging A/D Converter with Pipelined Wide-Band S/H," by Ishikawa and Tsukahara, IEEE JOURNAL OF SOLID-STATE CIRCUITS, Vol. 24, No. 6, December 1989, pages 1485–1491. The problem of turn off charge in a MOSFET analog switch and a feedback circuit to reduce the error are discussed in "A High-Speed Sample-and-Hold Technique Using a Miller Hold Capacitance," by Lim and Wooley, IEEE JOURNAL OF SOLID-STATE CIRCUITS, Vol. 26, No. 4, April 1991, pages 643–651. Turn off charge in a MOSFET analog switch and the use of a dummy transistor to reduce the error are discussed in "Dummy Transistor Compensation of Analog MOS Switches," by Eichenberger and Guggenbuhl, IEEE JOURNAL OF SOLID-STATE CIRCUITS, Vol. 24, No. 4, August 1989, pages 1143–1145 and "On Charge Injection in Analog MOS Switches and Dummy Switch Compensation Techniques," by Eichenberger and Guggenbuhl, IEEE TRANSACTIONS ON CIRCUITS AND SYSTEMS, Vol. 37, No. 2, February 1990, pages 256–264.

The use of a feedback circuit to control the error voltage due to the turn off charge in the MOSFET analog switch can reduce the error voltage but does not reduce the error voltage to zero. The use of the dummy transistor uses both a clock signal and an inverted clock signal and suffers from the variation in delay between the clock signal and the inverted clock signal. This invention uses only the clock signal and can reduce the error voltage to zero or nearly zero.

SUMMARY OF THE INVENTION

The metal oxide semiconductor, or MOS, analog switch for a sample and hold circuit is of key importance in high speed, high precision analog to digital converters. The charges injected during the turn off of the MOS analog switch has a significant effect on the precision of analog to digital converters in which they are used.

Figure 1:
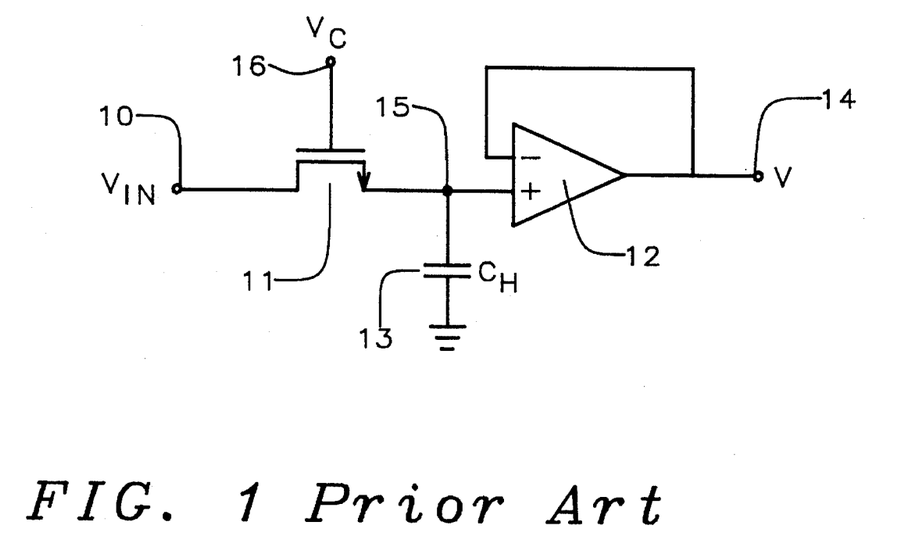
FIG. 1 is a circuit schematic of a conventional open loop MOSFET analog switch sample and hold circuit.

FIG. 1 shows a circuit schematic of a conventional open loop sample and hold circuit with an analog MOS switch. The circuit is comprised of a metal oxide semiconductor field effect transistor 11, or MOSFET, with the drain connected to the input voltage 10, the gate connected to the clock voltage 16, and the source connected to the first terminal of a holding capacitor 13 and the input of an operational amplifier connected for unity gain 12. The second terminal of the holding capacitor 13 is connected to ground. The output 14 of the operational amplifier 12 is the output of the sample and hold circuit. When the MOSFET 11 is on the holding capacitor 13 charges to the input voltage. When the clock voltage turns the MOSFET 11 off, however, a quantity of charge flows from the MOSFET 11 to the holding capacitor 13 causing an error in the voltage stored on the holding capacitor 13.

Figure 2:
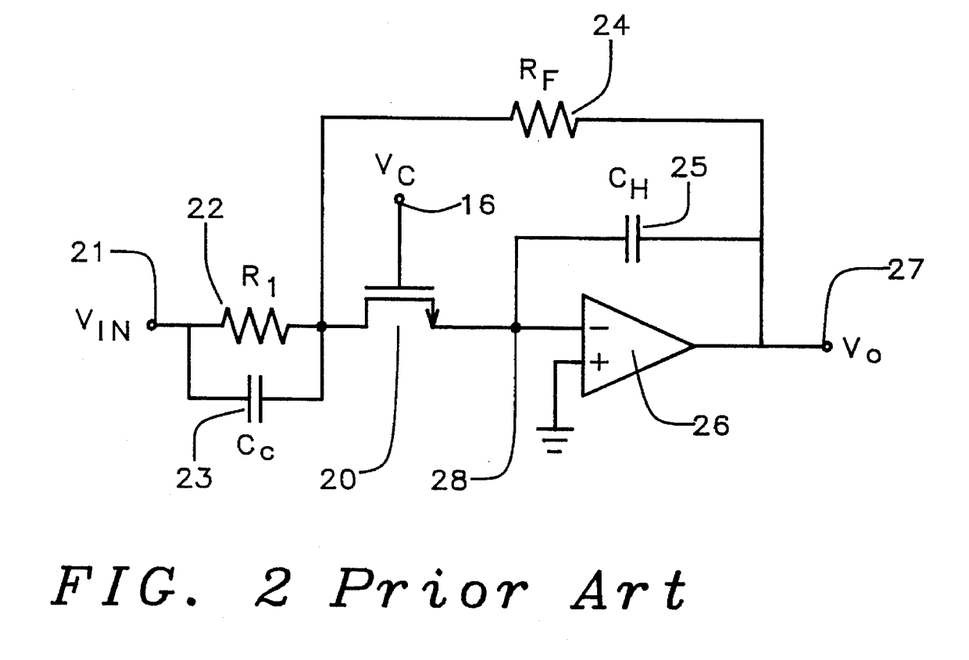
FIG. 2 is a circuit schematic of a conventional closed loop MOSFET analog switch sample and hold circuit.

FIG. 2 shows a circuit schematic of a conventional closed loop sample and hold circuit with an analog MOS switch. The circuit is comprised of a MOSFET 20 with the drain connected to the first terminal of an input resistor 22 and the first terminal of an input capacitor 23, the gate connected to the clock voltage 16, and the source connected to the first terminal of a holding capacitor 25 and the negative input of ah operational amplifier connected for unity gain 26. The second terminal of the input resistor 22 and the second terminal of the input capacitor 23 are connected to the input voltage 21. The output 27 of the operational amplifier 26 is connected to the second terminal of the holding capacitor 25 and to the first terminal of a feedback resistor 24. The second terminal of the feedback resistor 24 is connected to the drain of the MOSFET. When the MOSFET 20 is on the holding capacitor 25 charges to the input voltage. When the clock voltage turns the MOSFET 20 off, however, a quantity of charge flows from the MOSFET 20 to the holding capacitor 25 causing an error in the voltage stored on the holding capacitor 25. The closed loop sample and hold circuit is slower than the open loop sample and hold circuit making the open loop sample and hold circuit preferred.

Figure 3:
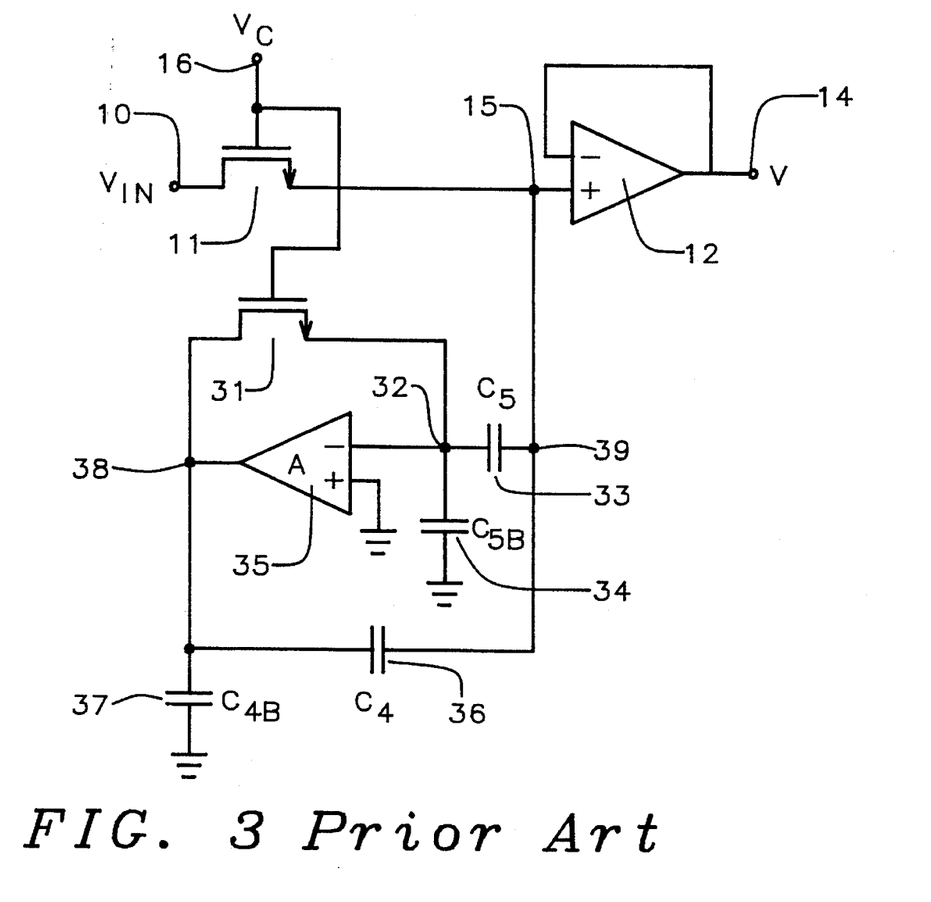
FIG. 3 is a circuit schematic of a conventional open loop MOSFET analog switch sample and hold circuit using a feedback circuit to compensate for the error voltage.

FIG. 3 shows a schematic of a conventional means to correct for the error voltage in the open loop sample and hold circuit due to the turn off charge of the MOSFET analog switch 11. This means uses a feedback circuit to replace the holding capacitor 13 of FIG. 1. The feedback circuit, often referred to as a Miller effect feedback circuit, comprises a second MOSFET 31, a second operational amplifier 35 and two capacitors 33 and 36. The two capacitors each have a parasitic capacitance to ground 34 and 37 shown in FIG. 3. The feedback circuit increases the holding capacitance and reduces the error caused by the turn off charge of the MOSFET analog switch 11 but does not eliminate the error.

Figure 4:
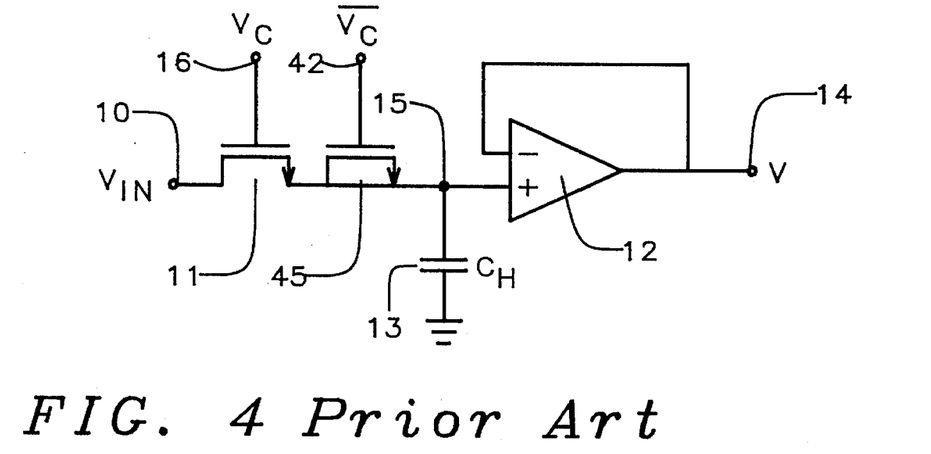
FIG. 4 sa circuit schematic of a conventional open loop MOSFET analog switch sample and hold circuit using a dummy MOSFET to compensate for the error voltage.

FIG. 4 shows a schematic of another conventional means to Correct for the error voltage in the open loop sample and hold circuit due to the turn off charge of the MOSFET analog switch 11. This means uses a dummy MOSFET 45 connected in series between the source of the MOSFET analog switch 11 and the input of the operational amplifier connected for unity gain 12. The gate of the dummy MOSFET 45 is connected to the inverse of the clock voltage 42. The source and drain of the dummy MOSFET 45 are connected together. Connected in this manner the dummy MOSFET should exactly compensate for the turn off charge of the MOSFET analog switch 11 since the dummy MOSFET 45 turns on as the MOSFET analog switch 11 turns off and turns off as the MOSFET analog switch 11 turns on. However, there is frequently a variation an delay between the Clock signal and the inverted clock signal which results in an error voltage due to the turn off charge of the MOSFET analog switch 11.

Figure 5:
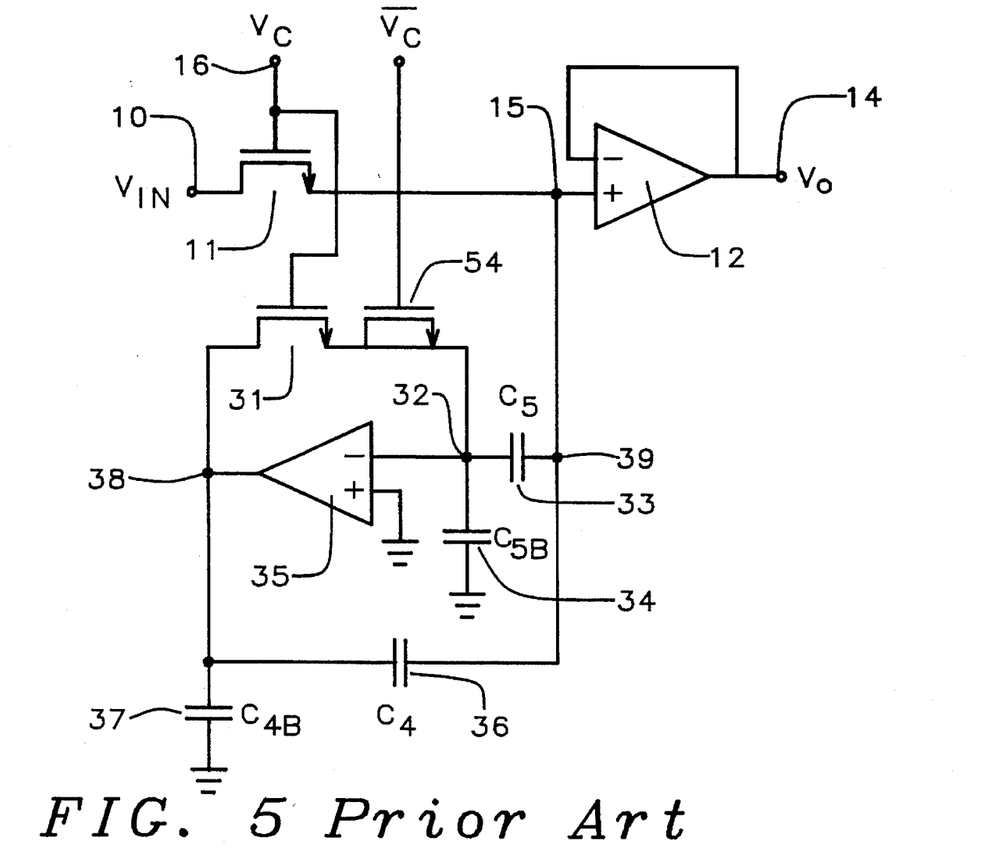
FIG. 5 is a circuit schematic of a conventional open loop MOSFET analog switch sample and hold circuit using a feedback circuit and a dummy MOSFET to compensate for the error voltage.

FIG. 5 shows a schematic of another conventional means to correct for the error voltage in the open loop sample and hold circuit due to the turn off charge of the MOSFET analog switch 11. This means uses a circuit which combines the dummy MOSFET with the feedback circuit shown in FIG. 3. Although reduced the error voltage remains due to the previously described problems.

Figure 6:
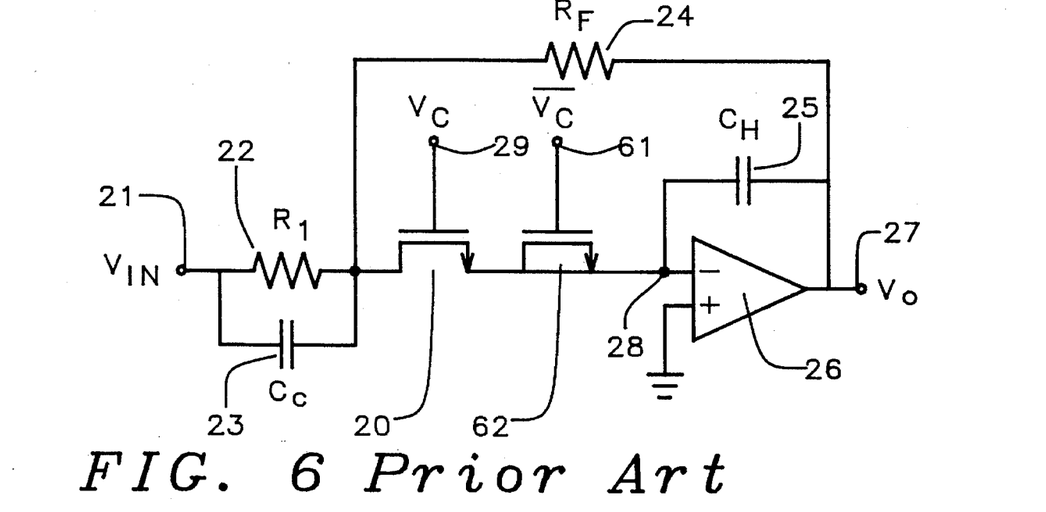
FIG. 6 is a circuit schematic of a conventional closed loop MOSFET analog switch sample and hold circuit using a dummy MOSFET to compensate for the error voltage.

FIG. 6 shows another conventional means to correct for the error voltage in the closed loop sample and hold circuit due to the turn off charge of the MOSFET analog switch 11. This means uses a dummy MOSFET 62 connected in series between the source of the MOSFET analog switch 20 and the input of the operational amplifier connected for unity gain 26. The gate of the dummy MOSFET 62 is connected to the inverse of the clock voltage 61. The source and drain of the dummy MOSFET 62 are connected together. The effectiveness of this method is also limited by the variation in delay between the clock signal and the inverted clock signal.

It is an object of this invention to provide a compensating circuit for use with MOS analog switch sample and hold circuits which provides superior reduction of the error voltage caused by the turn off of the MOSFET analog switch over that achieved by conventional means.

It is a further object of this invention to provide a compensating circuit in an open loop MOSFET analog switch sample and hold circuit which provides superior reduction of the error voltage caused by the turn off of the MOSFET analog switch over that achieved by conventional means.

It is a further object of this invention to provide a compensating circuit in a MOSFET analog switch sample and hold circuit with a feedback compensation cell which provides superior reduction of the error voltage caused by the turn off of the MOSFET analog switch over that achieved by conventional means.

It is a further object of this invention to provide a compensating circuit in a closed loop MOSFET analog switch sample and hold circuit which provides superior reduction of the error voltage caused by the turn off of the MOSFET analog switch over that achieved by conventional means.

Figure 7:
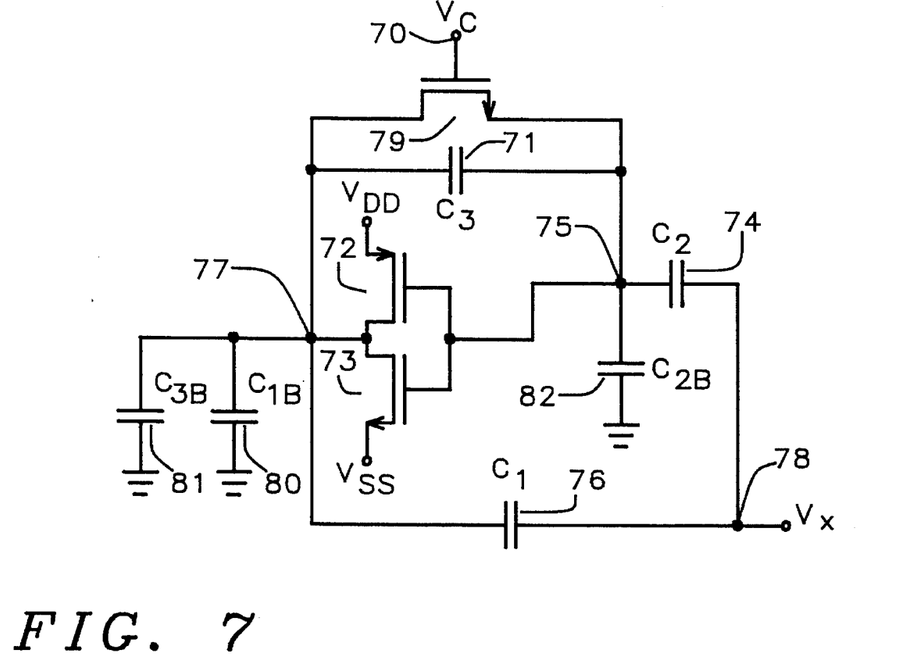
FIG. 7 is a circuit schematic of the compensating circuit of this invention including parasitic capacitances.

These objectives are achieved with the compensating circuit shown in FIG. 7. The compensating circuit comprises a MOSFET 79; a first capacitor, $C_1$, 76; a second capacitor, $C_2$, 74; a third capacitor, $C_3$, 71; and a complimentary metal oxide semiconductor, or CMOS, inverting amplifier formed from two CMOS transistors 72 and 73. The capacitors have parasitic capacitances associated with them $C_{1B}$, 80; $C_{2B}$, 82; and $C_{3B}$, 81. For a CMOS inverting amplifier with a gain significantly larger than one, the parasitic capacitors play no role in the operation in the compensating circuit and will not be shown hereinafter.

Figure 8:
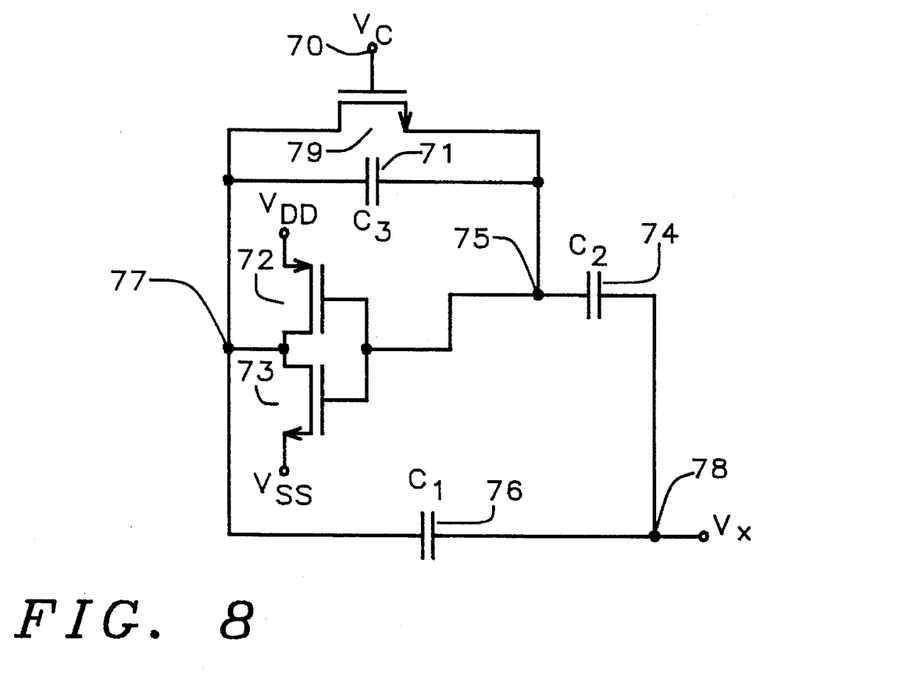
FIG. 8 is a circuit schematic of the compensating circuit of this invention without parasitic capacitances.

FIG. 8 Shows a schematic diagram of the compensating circuit without the parasitic capacitors. The compensating circuit is a first node 75, a second node 77, and a third node 78. The voltage, $V_x$, at the third node 78 due to the turn off charge, $Q_2$, of the MOSFET 79 injected into the first node 75 and the turn off charge, $Q_1$, of another MOSFET, not shown in FIG. 8, injected into the third node 78 is proportional to $Q_2$ multiplied by $C_1$ 76 subtracted from Q1 multiplied by C3 71 When the gain of the CMOS inverting amplifier is significantly greater than one. The capacitances $C_1$ and $C_3$ can be chosen to make $V_x$ zero or very nearly zero.

DESCRIPTION OF PREFERRED EMBODIMENTS

Refer now to FIG. 7 and FIG. 8, there is shown a preferred embodiment of the compensating circuit for a metal oxide semiconductor field effect transistor, or MOSFET, analog switch sample and hold circuit used in an analog to digital converter. FIG. 7 is a schematic diagram of the compensating circuit including the parasitic capacitances. The circuit comprises a first node 75, a second node 77, a third node 78, a MOSFET analog switch 79, a first capacitor 76, a second capacitor 74, a third capacitor 71, and a complimentary metal oxide semiconductor, or CMOS, inverting amplifier formed from a first CMOS transistor 72 and a second CMOS transistor 73. In this embodiment the first, second, and third capacitors each have a capacitance of at least 0.2 picofarads and the inverting amplifier has a gain of at least 30 dB. The gate of the MOSFET analog switch 79 is connected to the clock voltage 70. The source of the MOSFET analog switch 79, the first terminal of the third capacitor 71, the second terminal of the second capacitor 74 and the input of the CMOS inverting amplifier are connected to the first node 75. The drain of the MOSFET analog switch 79, the second terminal of the third Capacitor 71, the second terminal of the first capacitor 76, and the output of the CMOS inverting amplifier are connected to the second node 77. The first terminal of the first capacitor 76 and the first terminal of the second capacitor 74 are connected to the third node 78. A parasitic capacitance of the second capacitor 82 is shown between the first node 75 and ground. Parasitic capacitances of the first capacitor 80 and third capacitor 81 are shown between the second node 77 and ground.

Since the gain of the CMOS inverting amplifier is significantly greater than one, the parasitic capacitances have no effect on the error compensating characteristics of the compensating circuit and they will be omitted hereinafter. FIG. 8 shows a schematic diagram of the compensating circuit of this invention without the parasitic capacitances. In operation node three 78 is connected at the point in the circuit being compensated where the turn off charge causing the error is injected. There is a turn off charge, $Q_2$, from the MOSFET analog switch 79 in the compensating circuit of FIG. 8 injected into node one 75 and another turn off charge, $Q_1$, from the circuit being compensated, not shown in FIG. 8, injected into node three 78. The voltage at node three 78 due to these charges is proportional to $Q_2$ multiplied by the capacitance, $C_1$, of first capacitor 76 subtracted from $Q_1$ multiplied by the capacitance, $C_3$, of the third capacitor 71. By properly choosing the values of $C_1$ and $C_3$ the voltage at node three 78 due to turn off charges can be made zero or nearly zero. Often $Q_1$ and $Q_2$ are equal so that $C_1$ and $C_3$ are chosen to be equal.

Figure 9:
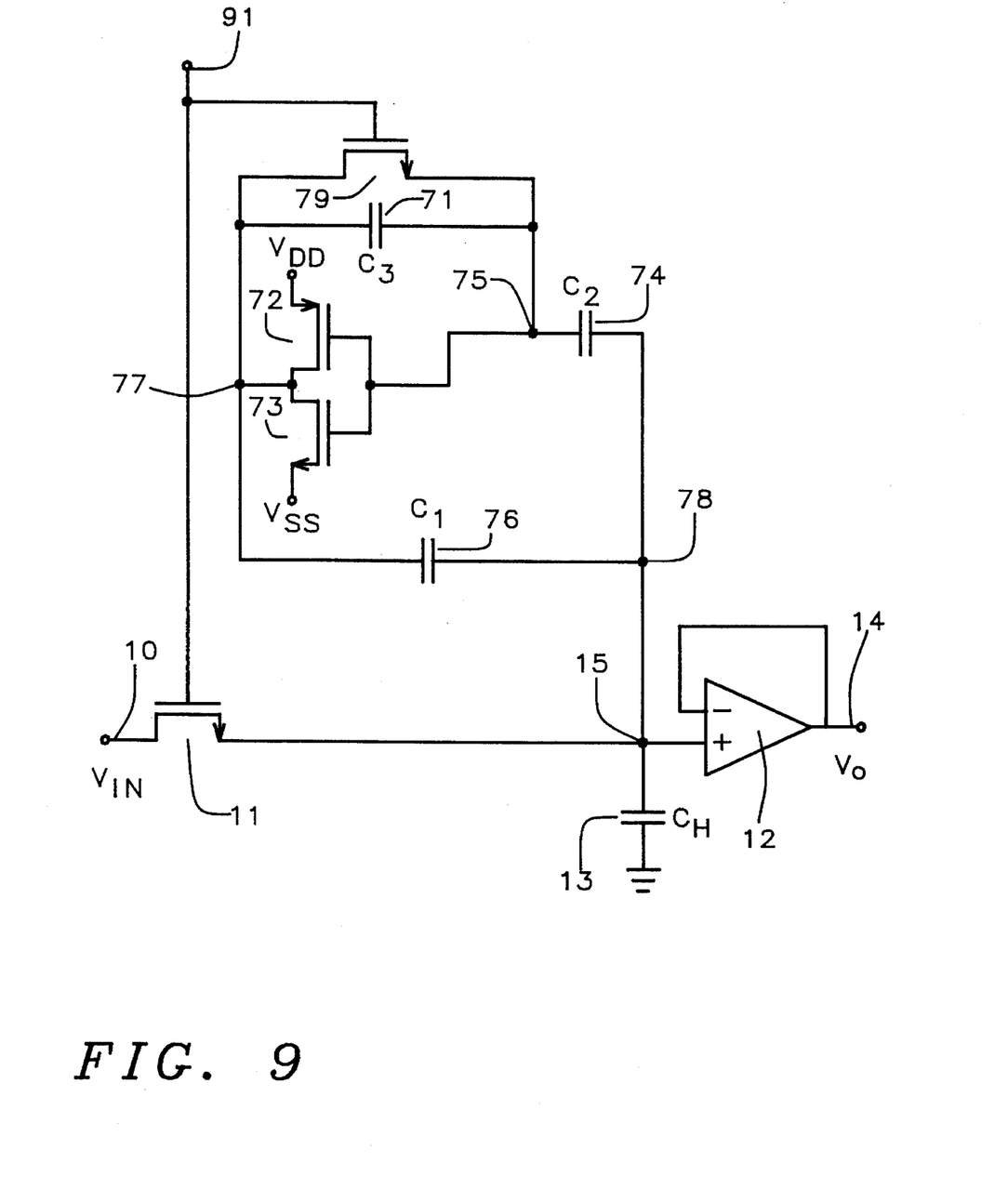
FIG. 9 is a circuit schematic of an open loop MOSFET analog switch sample and hold circuit using the compensating circuit of this invention to compensate for the error voltage.
Figure 12:
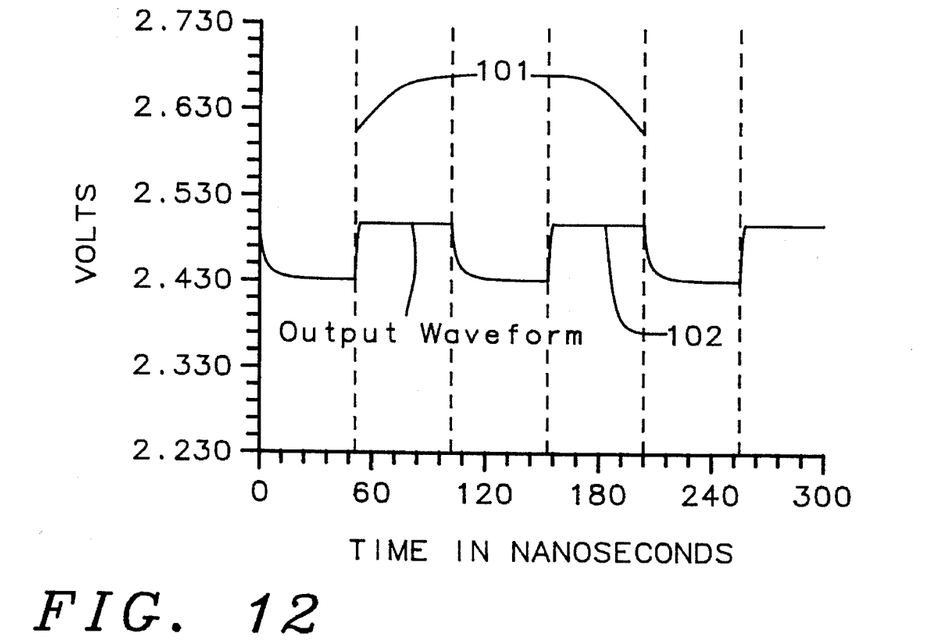
FIG. 12 is a computer simulation of the output voltage of the conventional open loop MOSFET analog switch sample and hold circuit of FIG. 1 with a constant voltage input.
Figure 13:
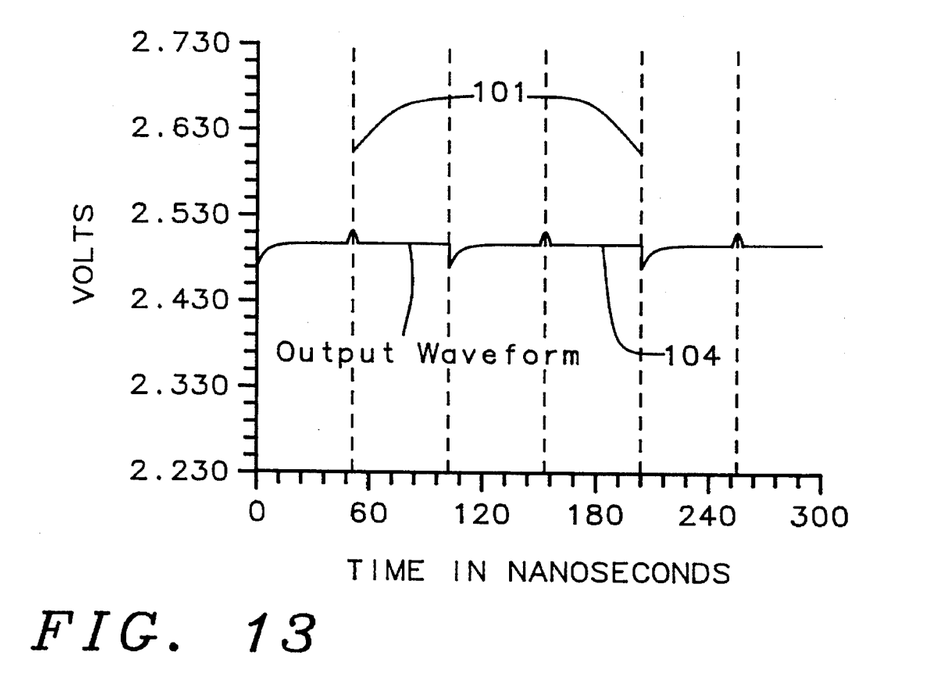
FIG. 13 is a computer simulation of the output voltage of the open loop MOSFET analog switch sample and hold circuit using the compensating circuit of this invention as shown in FIG. 9 with a constant voltage input.

Refer now to FIG. 9, FIG. 12, and FIG. 13, there is shown another embodiment of this invention. FIG. 9 shows a schematic diagram of the compensating circuit described in the previous embodiment used to compensate the turn off charge of the MOSFET analog switch 11 of the open loop sample and hold circuit of FIG. 1. The compensating circuit comprises a first node 75, a second node 77, a third node 78, a first MOSFET analog switch 79, a first capacitor 76, a second capacitor 74, a third capacitor 71, and a complimentary metal oxide semiconductor, or CMOS, inverting amplifier formed from a first CMOS transistor 72 and a second CMOS transistor 73. In this embodiment the first, second, and third capacitors each have a capacitance of at least 0.2 picofarads and the inverting amplifier has a gain of at least 30 dB. The gate of the first MOSFET analog switch 79 is connected to the clock voltage 91. The source of the first MOSFET analog switch 79, the first terminal of the third capacitor 71, the second terminal of the second capacitor 74, and the input of the CMOS inverting amplifier are connected to the first node 75. The drain of the first MOSFET analog switch 79, the second terminal of the third capacitor 71, the second terminal of the first capacitor 76, and the output of the CMOS inverting amplifier are connected to the second node 77. The first terminal of the first capacitor 76 and the first terminal of the second capacitor 74 are connected to the third node 78. The open loop sample and hold circuit comprises a second MOSFET analog switch 11, a holding capacitor 13, and an operational amplifier 12 connected for unity gain. The source of the second MOSFET analog switch 11 is connected to the first terminal of the holding capacitor 13, the input of the operational amplifier 12, and to node three 78 of the compensating circuit. The compensating circuit then keeps the error voltage very small.

FIG. 12 shows computer simulation results of the conventional open loop sample and hold circuit of FIG. 1. The voltage at the input 10 is held constant and the clock voltage turns the MOSFET analog switch 11 on and off at the clock switch points 101. As shown in FIG. 12 the output voltage 102 shifts about 70 millivolts at each clock switch point 101. FIG. 13 shows computer simulation results of the open loop sample and hold circuit compensated with the compensating circuit of this invention as shown in FIG. 9. The voltage at the input 10 is held constant at the same value as for the open loop sample and hold circuit without compensation. As shown in FIG. 13 the output voltage 104 is very nearly constant as the clock voltage turns the first MOSFET analog switch 79 and second MOSFET analog switch 11 on and off at the switch points 101.

Figure 10:
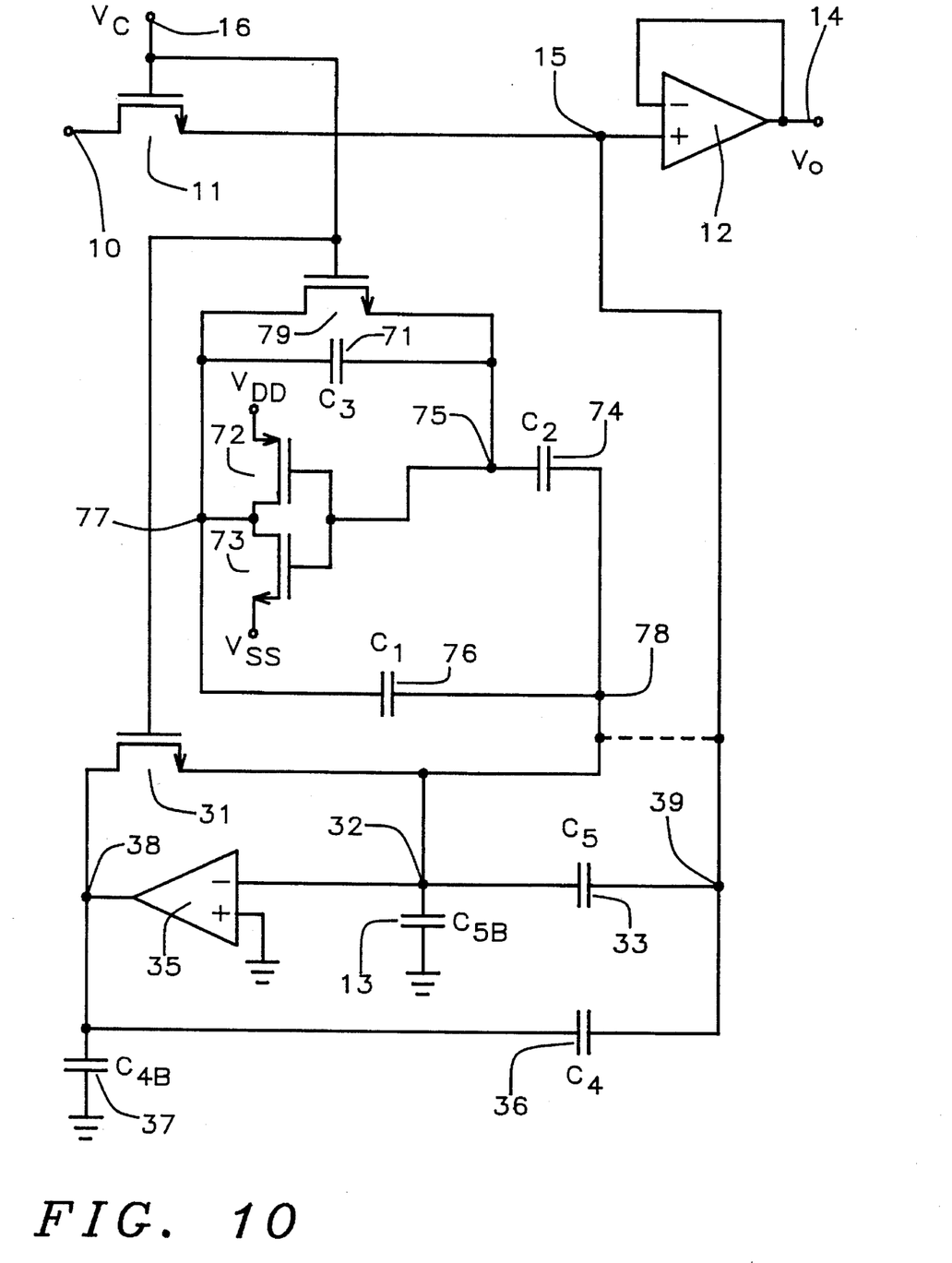
FIG. 10 is a circuit schematic of an open loop MOSFET analog switch sample and hold circuit using a feedback circuit and the compensating circuit of this invention to compensate for the error voltage.
Figure 14:
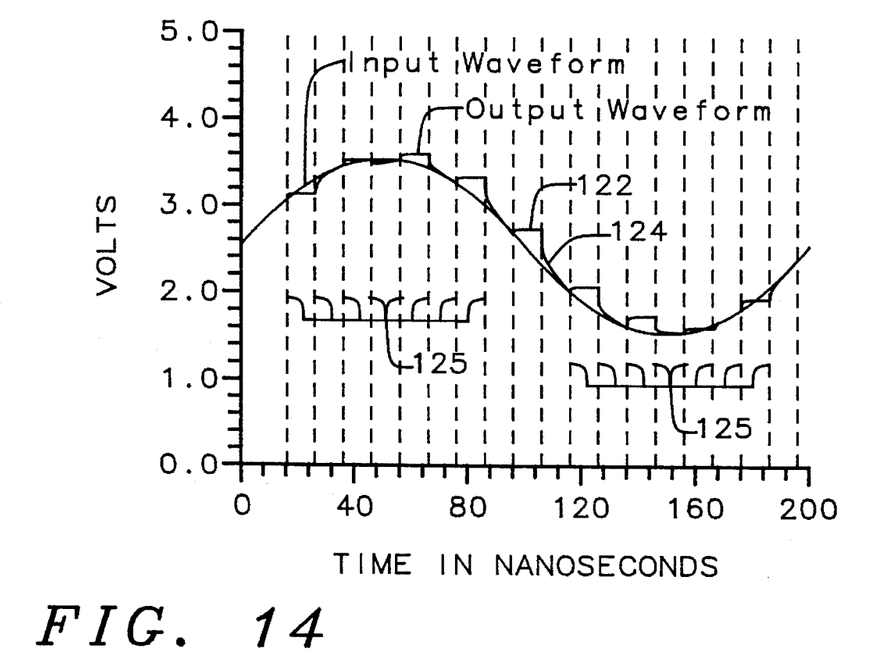
FIG. 14 is a computer simulation of the output voltage of the conventional open loop MOSFET analog switch sample and hold circuit using a feedback circuit for error compensation as shown in FIG. 3 with a sinusoidal voltage input.
Figure 15:
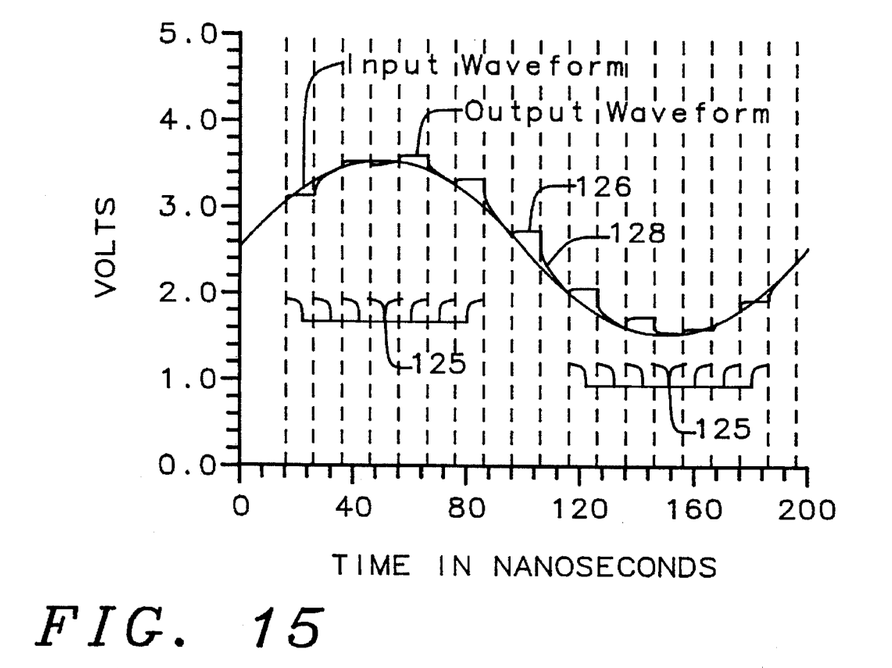
FIG. 15 is a computer simulation of the output voltage of the open loop MOSFET analog switch sample and hold circuit using a feedback circuit and the compensating circuit of this invention as shown in FIG. 10 with a sinusoidal voltage input.

Refer now to FIG. 10, FIG. 14, and FIG. 15, there is shown another embodiment of the compensating circuit of this invention. This embodiment, shown in FIG. 10, uses the compensating circuit of this invention in an open loop sample and hold circuit using a feedback circuit. The feedback circuit, often referred to as a Miller effect feedback circuit, is used with the open loop sample and hold circuit of the previous embodiment which comprises a first MOSFET analog switch 11 and a first operational amplifier 12. The feedback circuit comprises a third MOSFET analog switch 31, a second operational amplifier 35 and two capacitors 33 and 36. The two capacitors each have a parasitic capacitance to ground 34 and 37. The compensating circuit of this invention is the same as described in the two previous embodiments. Node three 78 of the compensating circuit is connected to the source of the third MOSFET analog switch 31, or can be connected to the source of the first MOSFET analog switch 11.

FIG. 14 shows computer simulation results of a conventional open loop sample and hold circuit using a feedback circuit, shown in FIG. 3, with a sinusoidal voltage at the input 10. FIG. 14 shows the simulated input voltage 124 and output voltage 122 sampled at the clock switching points 125. FIG. 15 shows computer simulation results of an open loop sample and held circuit using a feedback circuit and the compensating circuit of this embodiment, shown in FIG. 10, with the same input voltage and switching conditions as for the simulation results shown in FIG. 14. FIG. 15 shows the simulated input voltage 128 and output voltage 126 sampled at the clock switching points 125. The error of the sampled output voltage can be seen to be much smaller in FIG. 15 than in FIG. 14.

Figure 11:
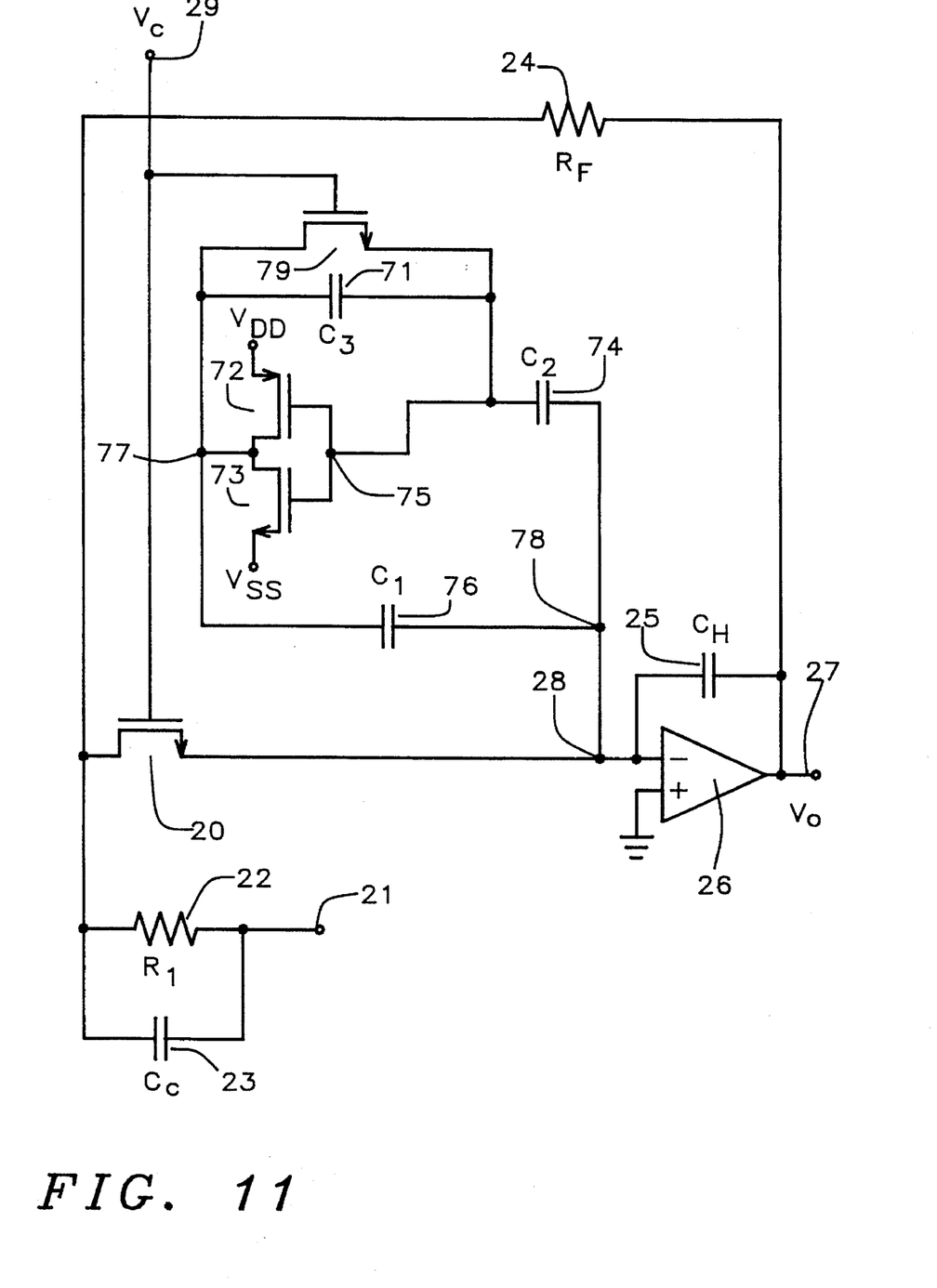
FIG. 11 is a circuit schematic of a closed loop MOSFET analog switch sample and hold circuit using the compensating circuit of this invention to compensate for the error voltage.
Figure 16:
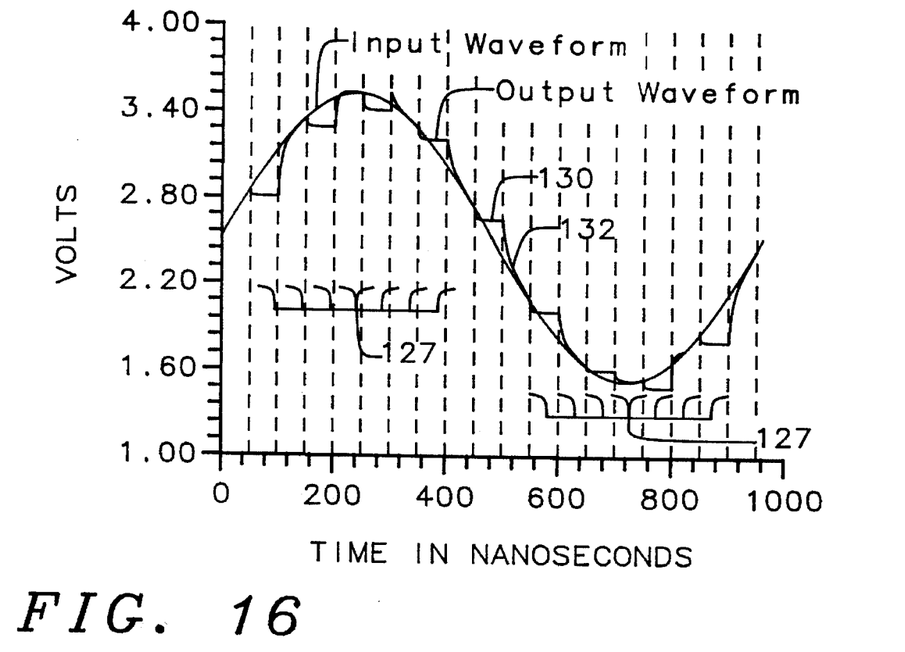
FIG. 16 is a computer simulation of the output voltage of conventional closed loop MOSFET analog switch sample and hold circuit as shown in FIG. 2 with a sinusoidal voltage input.
Figure 17:
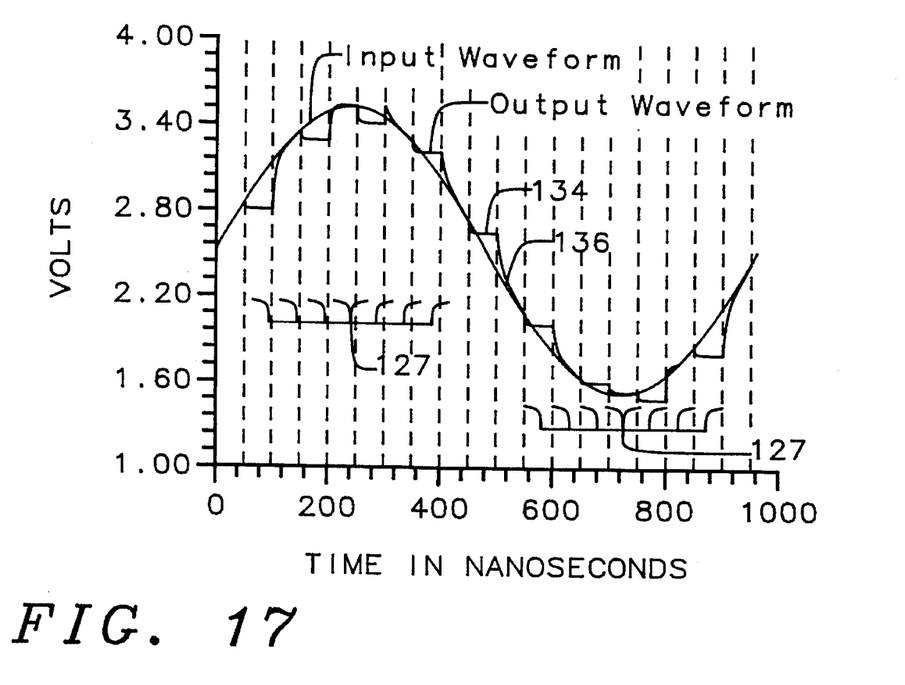
FIG. 17 is a computer simulation of the output voltage of a closed loop MOSFET analog switch sample and hold circuit using the compensating circuit of this invention for error compensation as shown in FIG. 11 with a sinusoidal voltage input.

Refer now to FIG. 11, FIG. 16, and FIG. 17, there is shown another embodiment of this invention. This embodiment, as shown in FIG. 11, uses the compensating circuit of this invention in the closed loop sample and hold circuit. The closed loop sample and hold circuit is comprised of a first MOSFET 20 with the drain connected to the first terminal of an input resistor 22 and the first terminal of an input capacitor 23, the gate connected to the clock voltage 29, and the source connected to the first terminal of a holding capacitor 25 and the negative input of an operational amplifier connected for unity gain 26. The second terminal of the input resistor 22 and the second terminal of the input capacitor 23 are connected to the input voltage 21. The output 27 of the operational amplifier 26 is connected to the second terminal of the holding capacitor 25 and to the first terminal of a feedback resistor 24. The second terminal of the feedback resistor 24 is connected to the drain of the first MOSFET 20. The compensating circuit of this embodiment is the same as described in the previous embodiments. The third node 78 of the compensating circuit is connected to the source of the first MOSFET 20.

FIG. 16 shows computer simulation results of the conventional closed loop sample and hold circuit shown in FIG. 2 for a sinusoidal input voltage. FIG. 16 shows the input voltage 132 and output voltage 130 sampled at the switching points 127. FIG. 17 shows computer simulation results of the closed loop sample and hold circuit with the compensating circuit of this embodiment, shown in FIG. 11, using the same input and switching conditions as in the simulation results of the conventional closed loop sample and hold circuit. FIG. 17 shows the input voltage 136 and output voltage 134 sampled at the switching points 127. The error of the sampled output voltage can be seen to be much smaller in FIG. 17 than in FIG. 16.

While the invention has been particularly shown and described with reference to the preferred embodiments thereof, it will be understood by those skilled in the art that various changes in form and details may be made without departing from the spirit and scope of the invention.

What is claimed is:

1. A circuit for compensating metal oxide semiconductor analog switches, comprising:

a first node;

a second node;

a third node;

a clock voltage signal;

a metal oxide semiconductor field effect transistor having a source, a drain, and a gate wherein said gate is connected to said clock voltage signal, said source is connected to said first node, and said drain is connected to said second node;

a complimentary metal oxide semiconductor field effect transistor inverting amplifier having an input and an output wherein said input of said complimentary metal oxide semiconductor field effect transistor inverting amplifier is connected to said first node and said output of said complimentary metal oxide semiconductor field effect transistor inverting amplifier is connected to said second node;

a first capacitor having a first terminal and a second terminal wherein said second terminal of said first capacitor is connected to said second node and said first terminal of said first capacitor is connected to said third node;

a second capacitor having a first terminal and a second terminal wherein said second terminal of said second capacitor is connected to said first node and said first terminal of said second capacitor is connected to said third node; and a third capacitor having a first terminal and a second terminal wherein said first terminal of said third capacitor is connected to said first node and said second terminal of said third capacitor is connected to said second node.

2. The circuit of claim 1 wherein said first capacitor has a capacitance of at least 0.2 picofarads.

3. The circuit of claim 1 wherein said second capacitor has a capacitance of at least 0.2 picofarads.

4. The circuit of claim 1 wherein said third capacitor has a capacitance of at least 0.2 picofarads.

5. The circuit of claim 1 wherein said complimentary metal oxide semiconductor field effect transistor inverting amplifier has a gain of at least 30 dB.

6. A circuit having Compensation for a metal oxide semiconductor analog switch, comprising:

a first node;

a second node;

a third node;

a clock voltage signal;

a ground node;

an input node;

an output node;

a first metal oxide; semiconductor field effect transistor having a source, a drain, and a gate wherein said gate of said first metal oxide semiconductor field effect transistor is connected to said clock voltage signal, said source of said first metal oxide semiconductor field effect transistor is connected to said first node, and said drain of said first metal oxide semiconductor field effect transistor is connected to said second node;

a complimentary metal oxide semiconductor field effect transistor inverting amplifier having an input and an output wherein said input of said complimentary metal oxide semiconductor field effect transistor inverting amplifier is connected to said first node and said output of said complimentary metal oxide semiconductor field effect transistor inverting amplifier is connected to said second node;

a first capacitor having a first terminal and a second terminal wherein said second terminal of said first capacitor is connected to said second node and said first terminal of said first capacitor is connected to said third node;

a second capacitor having a first terminal and a second terminal wherein said second terminal of said second capacitor is connected to said first node and said first terminal of said second capacitor is connected to said third node;

a third capacitor having a first terminal and a second terminal wherein said first terminal of said third capacitor is connected to said first node and said second terminal of said third capacitor is connected to said second node;

a second metal oxide semiconductor field effect transistor having a source, a drain, and a gate wherein said gate of said second metal oxide semiconductor field effect transistor is connected to said clock voltage signal, said drain of said second metal oxide semiconductor field effect transistor is connected to said input node, and said source of said second metal oxide semiconductor field effect transistor is connected to said third node;

a holding capacitor having a first terminal and a second terminal wherein said first terminal of said holding capacitor is connected to said third node and said second terminal of said holding capacitor is connected to said ground node; and an operational amplifier having a positive input, a negative input, and an amplifier output wherein said positive input of said operational amplifier is connected to said third node, said negative input of said operational amplifier is connected to said output node and said amplifier output of said operational amplifier is connected to said output node.

7. The circuit of claim 6 wherein said first capacitor has a capacitance of at least 0.2 picofarads.

8. The circuit of claim 6 wherein said second capacitor has a capacitance of at least 0.2 picofarads.

9. The circuit of claim 6 wherein said third capacitor has a capacitance of at least 0.2 picofarads.

10. The circuit of claim 6 wherein said complimentary metal oxide semiconductor field effect transistor inverting amplifier has a gain of at least 30 dB.

11. A circuit having compensation for a metal oxide semiconductor analog switch, comprising:

a first node;

a second node;

a third node;

a fourth node;

a fifth node;

a clock voltage signal;

a ground node;

an input node;

an output node;

a first metal oxide semiconductor field effect transistor having a source, a drain, and a gate wherein said gate of said first metal oxide semiconductor field effect transistor is connected to salad clock voltage signal, said source of said first metal oxide semiconductor field effect transistor is connected to said first node, and said drain of said first metal oxide semiconductor field effect transistor is connected to said second node;

a complimentary metal oxide semiconductor field effect transistor inverting amplifier having an input and an output wherein said input of said complimentary metal oxide semiconductor field effect transistor inverting amplifier is connected to said first node and said output of said complimentary metal oxide semiconductor field effect transistor inverting amplifier is connected to said second node;

a first capacitor having a first terminal and a second terminal wherein said second terminal of said first capacitor is connected to said second node and said first terminal of said first capacitor is connected to said third node;

a second capacitor having a first terminal and a second terminal wherein said second terminal of said second capacitor is connected to said first node and said first terminal of said second capacitor is connected to said third node;

a third capacitor having a first terminal and a second terminal wherein said first terminal of said third capacitor is connected to said first node and said second terminal of said third capacitor is connected to said second node;

a second metal oxide semiconductor field effect transistor having a source, a drain, and a gate wherein said gate of said second metal oxide semiconductor field effect transistor is connected to said clock voltage signal, said drain of said second metal oxide semiconductor field effect transistor is connected to said input node, and said source of said second metal oxide semiconductor field effect transistor is connected to said fifth node;

a third metal oxide semiconductor field effect transistor having a source, a drain, and a gate wherein said gate of said third metal oxide semiconductor field effect transistor is connected to said clock voltage signal, said drain of said third metal oxide semiconductor field effect transistor is connected to said fourth node, and said source of said third metal oxide semiconductor field effect transistor is connected to said third node;

a first operational amplifier having a positive input, a negative input, and a first amplifier output wherein said positive input of said first operational amplifier is connected to said ground node, said negative input of said first operational amplifier is connected to said third node and said first amplifier output of said first operational amplifier is connected to said fourth node;

a fourth capacitor having a first terminal and a second terminal wherein said first terminal of said fourth capacitor is connected to said fifth node and said second terminal of said fourth capacitor is connected to said fourth node;

a fifth capacitor having a first terminal and a second terminal wherein said first terminal of said fifth capacitor is connected to said fifth node and said second terminal of said fifth capacitor is connected to said third node; and a second operational amplifier having a positive input, a negative input, and a second amplifier output wherein said positive input of said first operational amplifier is connected to said fifth node, said negative input of said second operational amplifier is connected to said output node and said second amplifier output of said second operational amplifier is connected to said output node.

12. The circuit of claim 11 wherein said first capacitor has a capacitance of at least 0.2 picofarads.

13. The circuit of claim 11 wherein said second capacitor has a capacitance of at least 0.2 picofarads.

14. The circuit of claim 11 wherein said third capacitor has a capacitance of at least 0.2 picofarads.

15. The circuit of claim 11 wherein said complimentary metal oxide semiconductor field effect transistor inverting amplifier has a gain of at least 30 dB.

16. A circuit having compensation for a metal oxide semiconductor analog switch, comprising:

a first node;

a second node;

a third node;

a fourth node;

a clock voltage signal;

a ground node;

an input node;

an output node;

a first metal oxide semiconductor field effect transistor having a source, a drain, and a gate wherein said gate of said first metal oxide semiconductor field effect transistor is connected to said clock voltage signal, said source of said first metal oxide semiconductor field effect transistor is connected to said first node, and said drain of said first metal oxide semiconductor field effect transistor is connected to said second node;

a complimentary metal oxide semiconductor field effect transistor inverting amplifier having an input and an output wherein said input of said complimentary metal oxide semiconductor field effect transistor inverting amplifier is connected to said first node and said output of said complimentary metal oxide semiconductor field effect transistor inverting amplifier is connected to said second node;

a first capacitor having a first terminal and a second terminal wherein said second terminal of said first capacitor is connected to said second node and said first terminal of said first capacitor is connected to said third node;

a second capacitor having a first terminal and a second terminal wherein said second terminal of said second capacitor is connected to said first node and said first terminal of said second capacitor is connected to said third node;

a third capacitor having a first terminal and a second terminal wherein said first terminal of said third capacitor is connected to said first node and said second terminal of said third capacitor i$ connected to said second node;

a second metal oxide semiconductor field effect transistor having a source, a drain, and a gate wherein said gate of said second metal oxide semiconductor field effect transistor is connected to said clock voltage signal, said drain of said second metal oxide semiconductor field effect transistor is connected to said fourth node, and said source of said second metal oxide semiconductor field effect transistor is connected to said third node;

a first resistor having a first terminal and a second terminal wherein said first terminal of said first resistor is connected to said input node and said second terminal of said first resistor is connected to said fourth node;

a shunt capacitor having a first terminal and a second terminal wherein said first terminal of said shunt capacitor is connected to said input node and said second terminal of said shunt capacitor is connected to said fourth node;

a feedback resistor having a first terminal and a second terminal wherein said first terminal of said feedback resistor is connected to said fourth node and said second terminal of said feedback resistor is connected to said output node;

an operational amplifier having a positive input, a negative input, and an amplifier output wherein said positive input of said operational amplifier is connected to said ground node, said negative input of said operational amplifier is connected to said output node and said amplifier output of said operational amplifier is connected to said output node; and a holding capacitor having a first terminal and a second terminal wherein said first terminal of said holding capacitor is connected to said third node and said second terminal of said holding capacitor is connected to said output node.

17. The circuit of claim 16 wherein said first capacitor has a capacitance of at least 0.2 picofarads.

18. The circuit of claim 16 wherein said second capacitor has a capacitance of at least 0.2 picofarads.

19. The circuit of claim 16 wherein said third capacitor has a capacitance of at least 0.2 picofarads.

20. The circuit of claim 16 wherein said complimentary metal oxide semiconductor field effect transistor inverting amplifier has a gain of 7 at least 30 dB.

* * * * *